United States Patent
Miura

(10) Patent No.: US 10,333,692 B2
(45) Date of Patent: *Jun. 25, 2019

(54) RECEPTION APPARATUS

(71) Applicant: THINE ELECTRONICS, INC., Tokyo (JP)

(72) Inventor: Satoshi Miura, Tokyo (JP)

(73) Assignee: THINE ELECTRONICS, INC., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/910,115

(22) PCT Filed: Mar. 16, 2015

(86) PCT No.: PCT/JP2015/057705
§ 371 (c)(1),
(2) Date: Feb. 4, 2016

(87) PCT Pub. No.: WO2015/156089
PCT Pub. Date: Oct. 15, 2015

(65) Prior Publication Data
US 2016/0294542 A1 Oct. 6, 2016

(30) Foreign Application Priority Data
Apr. 10, 2014 (JP) ................. 2014-080815

(51) Int. Cl.
*H04L 7/033* (2006.01)
*H03L 7/08* (2006.01)
(Continued)

(52) U.S. Cl.
CPC .......... *H04L 7/0331* (2013.01); *H03L 7/0807* (2013.01); *H03L 7/091* (2013.01);
(Continued)

(58) Field of Classification Search
CPC ............ H04L 7/0062; H04L 25/03949; H04L 7/0058; H04L 25/03878; H04L 7/0008; H04L 7/0054; H03L 7/0807
(Continued)

(56) References Cited

U.S. PATENT DOCUMENTS 5,297,173 A 3/1994 Hikmet et al.
5,937,020 A * 8/1999 Hase ................ G11B 20/10009
327/141
(Continued)

FOREIGN PATENT DOCUMENTS

CN 1609958 A 4/2005
CN 101222288 A 7/2008
(Continued)

OTHER PUBLICATIONS

International Search Report, issued by International Searching Authority in corresponding International Application No. PCT/JP2015/057705, dated May 19, 2015.
(Continued)

*Primary Examiner* — Emmanuel Bayard
(74) *Attorney, Agent, or Firm* — Sughrue Mion, PLLC

(57) ABSTRACT

Provided is a reception apparatus capable of shortening a time period until the original data and clock can be recovered from a digital signal after temporary superimposition of noise on the digital signal stops. A reception apparatus 20 includes a receiver unit 21, a voltage-controlled oscillator 22, a sampler unit 23, a control voltage generation unit 24, an error detection unit 25, a training control unit 26, and an equalizer control unit 27. The receiver unit 21 includes an equalizer unit 21A. When the error detection unit 25 detects an error of a digital signal, the reception apparatus 20 causes a phase/frequency comparison by the control voltage generation unit 24 to be stopped.

17 Claims, 3 Drawing Sheets

(51) Int. Cl.
*H03L 7/091* (2006.01)
*H03L 7/099* (2006.01)
*H04L 7/00* (2006.01)
*H04L 7/04* (2006.01)
*H04L 7/10* (2006.01)

(52) U.S. Cl.
CPC ............ *H03L 7/099* (2013.01); *H04L 7/0054* (2013.01); *H04L 7/0083* (2013.01); *H04L 7/0087* (2013.01); *H04L 7/033* (2013.01); *H04L 7/048* (2013.01); *H04L 7/10* (2013.01)

(58) Field of Classification Search
USPC ... 375/229, 232–233, 326–32, 339, 354–358
See application file for complete search history.

(56) References Cited

U.S. PATENT DOCUMENTS

| | | | |
|---|---|---|---|
| 6,044,123 A | 3/2000 | Takla | |
| 7,023,941 B1* | 4/2006 | Rey | H04L 7/0058 375/232 |
| 7,065,133 B1* | 6/2006 | Phanse | H04L 25/45 375/219 |
| 7,230,985 B2* | 6/2007 | Park | H04L 25/03878 326/93 |
| 7,254,198 B1* | 8/2007 | Manickam | H04L 25/03057 375/233 |
| 7,257,172 B2* | 8/2007 | Okamoto | G11B 20/10009 375/263 |
| 7,525,887 B2* | 4/2009 | Ogura | G11B 20/10009 369/47.19 |
| 7,529,320 B2* | 5/2009 | Byrne | H04L 7/0054 375/316 |
| 7,542,507 B2* | 6/2009 | Sohn | H03L 7/0814 375/233 |
| 7,545,861 B2* | 6/2009 | Seo | H04L 7/0058 375/233 |
| 7,646,807 B1* | 1/2010 | Manickam | H04L 25/03057 375/232 |
| 7,664,172 B1* | 2/2010 | Manickam | H04L 25/03057 375/232 |
| 7,756,228 B1* | 7/2010 | Manickam | H04L 25/03057 375/285 |
| 8,005,135 B1* | 8/2011 | Manickam | H04L 25/03057 375/232 |
| 8,050,317 B2* | 11/2011 | Okamura | H04L 25/03019 375/229 |
| 8,175,193 B2* | 5/2012 | Kim | H04L 27/066 375/270 |
| 8,358,939 B2* | 1/2013 | Komaki | H04B 10/60 375/316 |
| 8,363,757 B1* | 1/2013 | Meng | H03J 7/04 370/208 |
| 8,432,957 B2* | 4/2013 | Kim | H04L 7/007 375/226 |
| 8,441,751 B1* | 5/2013 | Song | G11B 20/10009 360/25 |
| 8,447,000 B2* | 5/2013 | Manickam | H04L 25/03057 375/285 |
| 8,687,471 B2* | 4/2014 | Xie | G11B 20/10009 369/47.28 |
| 8,839,020 B2* | 9/2014 | Zhuang | H03L 7/0807 327/141 |
| 8,879,615 B1* | 11/2014 | Gagnon | H04L 25/03305 375/224 |
| 9,001,631 B2* | 4/2015 | Xie | G11B 20/10009 369/47.15 |
| 9,048,999 B2* | 6/2015 | He | H04L 7/0062 |
| 9,178,683 B2* | 11/2015 | Varma | H04L 7/0008 |
| 2005/0088935 A1 | 4/2005 | Nakata et al. | |
| 2006/0039515 A1* | 2/2006 | Lee | H04L 27/2675 375/355 |
| 2007/0036257 A1 | 2/2007 | Hu | |
| 2008/0219392 A1* | 9/2008 | Riani | G11B 20/10009 375/371 |
| 2010/0238993 A1* | 9/2010 | Huang | H04L 7/0337 375/233 |
| 2011/0037505 A1* | 2/2011 | Kawamoto | H03L 7/07 327/159 |
| 2012/0147999 A1* | 6/2012 | Imanishi | H04J 3/0632 375/340 |
| 2012/0230454 A1* | 9/2012 | Mobin | H04L 7/0083 375/354 |
| 2012/0306538 A1* | 12/2012 | Aryanfar | H03L 7/0816 327/5 |
| 2014/0139266 A1* | 5/2014 | Kenney | G01R 25/005 327/9 |
| 2014/0219406 A1* | 8/2014 | Chen | H03L 7/085 375/362 |
| 2014/0230004 A1* | 8/2014 | Kim | H04L 7/027 725/116 |
| 2014/0267925 A1* | 9/2014 | Koroglu | H04N 5/4401 348/726 |
| 2014/0281085 A1* | 9/2014 | Ebert | G06F 1/3253 710/200 |
| 2015/0162922 A1* | 6/2015 | Song | H04L 7/0091 375/376 |
| 2015/0214940 A1* | 7/2015 | Shibasaki | H03K 5/135 327/238 |
| 2015/0249556 A1* | 9/2015 | He | H04L 7/0062 375/233 |
| 2015/0256326 A1* | 9/2015 | Simpson | H04L 7/0025 375/355 |
| 2017/0118010 A1* | 4/2017 | Fujita | H04L 7/0083 |

FOREIGN PATENT DOCUMENTS

| | | |
|---|---|---|
| CN | 101361312 A | 2/2009 |
| CN | 203434996 U | 2/2014 |
| EP | 2 075 949 A1 | 7/2009 |
| JP | 3-280708 A | 12/1991 |
| JP | 3-297236 A | 12/1991 |
| JP | 5-67374 A | 3/1993 |
| JP | 6-76477 A | 3/1994 |
| JP | 9-27829 A | 1/1997 |
| JP | 2010-103845 A | 5/2010 |
| JP | 2012205204 A | 10/2012 |
| WO | 2009060763 A1 | 5/2009 |

OTHER PUBLICATIONS

International Preliminary Report on Patentability issued from the International Bureau in counterpart International Application No. PCT/JP2015/057705, dated Oct. 20, 2016.

Extended Search Report, issued by International Searching Authority in corresponding International Application No. PCT/JP2015/057705 dated Nov. 16, 2017.

Communication dated Jan. 29, 2018 from the State Intellectual Property Office of the P.R.C. in counterpart Application No. 201580001521.1.

* cited by examiner

RECEPTION APPARATUS

CROSS REFERENCE TO RELATED APPLICATIONS

This application is a National Stage of International Application No. PCT/JP2015/057705 filed Mar. 16, 2015, claiming priority based on Japanese Patent Application No. 2014-080815 filed Apr. 10, 2014, the contents of all of which are incorporated herein by reference in their entirety.

TECHNICAL FIELD

The present invention relates to a reception apparatus.

BACKGROUND ART

Clock data recovery (CDR) technology for transmitting a digital signal obtained by embedding clock information in data from a transmission apparatus on a transmission path and recovering data and a clock in a reception apparatus receiving the digital signal arriving via the transmission path is known (see Patent Literature 1). In the CDR technology, the reception apparatus generates recovered data by sampling the digital signal according to the recovered clock and generates the recovered clock by performing feedback control so that a phase and a frequency match between the digital signal or recovered data and the recovered clock.

CITATION LIST

Patent Literature

Patent Literature 1 PCT International Publication No. WO 2009/060763

SUMMARY OF INVENTION

Technical Problem

In a transmission/reception system including a transmission apparatus and a reception apparatus adopting the CDR technology, noise may be temporarily superimposed on a digital signal due to an external factor such as static electricity when the digital signal is transmitted from the transmission apparatus to the reception apparatus via the transmission path. In this case, the reception apparatus may recover a clock of a frequency/phase significantly different from an original frequency/phase and recover data of a value different from an original value when the data and the clock are intended to be recovered on the basis of the digital signal on which noise is superimposed according to the feedback control.

After the superimposition of noise on the digital signal stops, the reception apparatus is configured to able to recover a clock having the original frequency/phase and recover data having the original value on the basis of a digital signal on which no noise is superimposed according to feedback control. However, in the conventional technology, a long time period may be required until the original data and clock can be recovered from the digital signal after temporary superimposition of noise on the digital signal stops.

The present invention has been made to solve the above-described problems and an objective of the invention is to provide a reception apparatus capable of shortening a time period until the original data and clock can be recovered from a digital signal after temporary superimposition of noise on, the digital signal stops.

Solution to Problem

A reception apparatus of the present invention is a reception apparatus for receiving a digital signal arriving via a transmission path after being transmitted from a transmission apparatus, the reception apparatus including: a voltage-controlled oscillator configured to input a control voltage and output a clock of a frequency according to a value of the control voltage; a sampler unit configured to input the digital signal, input the clock output from the voltage-controlled oscillator, and sample and hold data of the digital signal at a timing indicated by the clock to output the sampled and held data; a control voltage generation unit configured to obtain a phase or frequency difference between the digital signal or the data and the clock and generate the control voltage having a value for which the difference is reduced to output the generated control voltage to the voltage-controlled oscillator; and an error detection unit configured to detect an error of the digital signal, wherein, when the error detection unit detects the error of the digital signal, a phase/frequency comparison by the control voltage generation unit is stopped.

Also, a reception apparatus of the present invention is a reception apparatus for receiving a digital signal arriving via a transmission path after being transmitted from a transmission apparatus, the reception apparatus including: a voltage-controlled oscillator configured to input a control voltage and output a clock of a frequency according to a value of the control voltage; an equalizer unit configured to compensate for a waveform change due to a characteristic of the transmission path in the received digital signal; an equalizer control unit configured to control a compensation operation by the equalizer unit; a sampler unit configured to input the digital signal output from, the equalizer unit, input the clock output from the voltage-controlled oscillator, and sample and hold data of the digital signal at a timing indicated by the clock to output the sampled and held data; a control voltage generation unit configured to obtain a phase or frequency difference between the digital signal or the data and the clock and generate the control voltage having a value for which the difference is reduced to output the generated control voltage to the voltage-controlled oscillator; and an error detection unit configured to detect an error of the digital signal, wherein, when the error detection unit detects the error of the digital signal, a control operation by the equalizer control unit is stopped and the compensation operation by the equalizer unit before the error detection is continued.

Also, a reception apparatus of the present invention is a reception apparatus for receiving a digital signal arriving via a transmission path after being transmitted from a transmission apparatus, the reception apparatus including: a voltage-controlled oscillator configured to input a control voltage and output a clock of a frequency according to a value of the control voltage; a sampler unit configured to input the digital signal, input the clock output from the voltage-controlled oscillator, sample and hold data of the digital signal at a timing indicated by the clock to output the sampled and held data, and compensate for a waveform, change due to a characteristic of the transmission path in the digital signal received using its result; an equalizer control unit configured to control a compensation operation by the sampler unit; a control voltage generation unit configured to obtain a phase or frequency difference between the digital signal or the data and the clock and generate the control voltage having a value for which the difference is reduced to output the generated control voltage to the voltage-controlled oscillator; and an error detection unit configured to detect an error of the digital signal, wherein, when the error detection unit detects the error of the digital signal, a control operation by the equalizer control unit is stopped and the compensation operation by the sampler unit before the error detection is continued.

Also, a reception apparatus of the present invention is a reception apparatus for receiving a digital signal arriving via a transmission path after being transmitted from a transmission apparatus, the reception apparatus including: a voltage-controlled oscillator configured to input a control voltage and output a clock of a frequency according to a value of the control voltage; a sampler unit configured to input the digital signal, input the clock output from the voltage-controlled oscillator, and sample and hold data of the digital signal at a timing indicated by the clock to output the sampled and held data; a control voltage generation unit configured to obtain a phase or frequency difference between the digital signal or the data and the clock and generate the control voltage having a value for which the difference is reduced to output the generated control voltage to the voltage-controlled oscillator; an error detection unit configured to detect an error of the digital signal; and a training control unit configured to instruct the transmission apparatus to transmit a training pattern and instruct the control voltage generation unit to perform a comparison between frequencies on the basis of the training pattern arriving after being transmitted from the transmission apparatus or the data output from the sampler unit when the error detection unit detects the error of the digital signal.

In the reception apparatus of the present invention, the error detection unit may detect the error of the digital signal on the basis of a pattern of data output from the sampler unit or detect the error of the digital signal on the basis of a voltage value of the received digital signal.

A transmission/reception system of the present invention is a transmission/reception system including: a transmission apparatus configured to transmit a digital signal; and the above-described reception apparatus of the present invention configured to receive the digital signal arriving via the transmission path after being transmitted from the transmission apparatus. Also, when the reception apparatus instructs the transmission apparatus to transmit the training pattern, the transmission apparatus transmits the training pattern to the reception apparatus.

Advantageous Effects of Invention

According to the present invention, it is possible to shorten a time period until the original data and clock can be recovered from a digital signal after temporary superimposition of noise on the digital signal stops.

DESCRIPTION OF EMBODIMENTS

Hereinafter, modes for carrying out the present invention are described in detail with reference to the accompanying drawings. Also, the same elements in the description of the drawings are assigned the same reference signs and redundant description thereof will be omitted.

Figure 1:
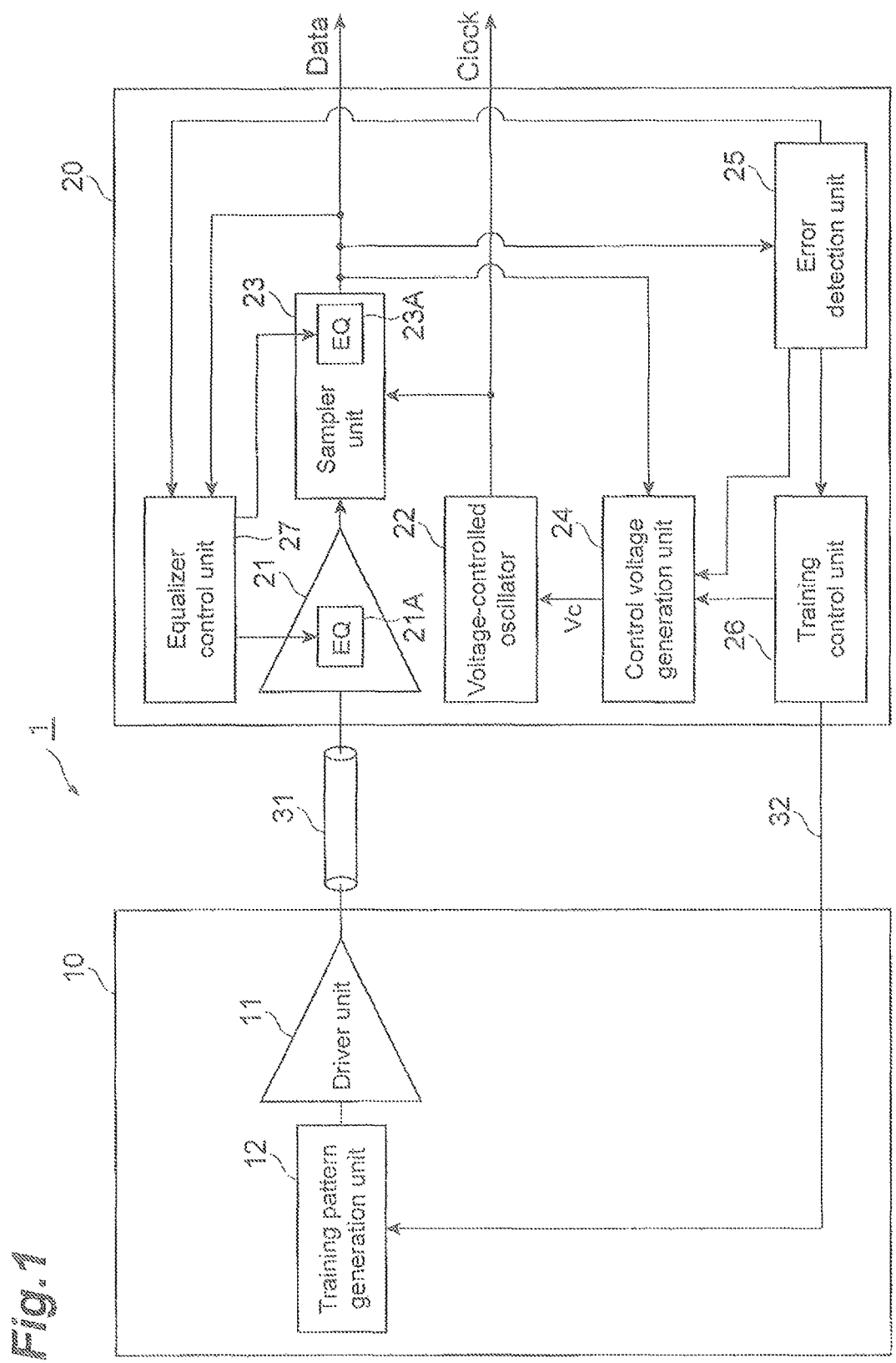
FIG. 1 is a diagram illustrating a configuration of a transmission/reception system 1 of the present embodiment.

FIG. 1 is a diagram illustrating a configuration of a transmission/reception system 1 of the present embodiment. The transmission/reception system 1 includes a transmission apparatus 10 and a reception apparatus 20. The transmission apparatus 10 and the reception apparatus 20 are connected through transmission paths 31 and 32. The transmission apparatus 10 transmits a digital signal obtained by embedding clock information in data to the transmission path 31. The reception apparatus 20 receives the digital signal arriving via the transmission path 31 and recovers data and a clock on the basis of the digital signal.

The transmission apparatus 10 includes a driver unit 11 and a training pattern generation unit 12. The driver unit 11 transmits the digital signal to the transmission path 31 and also transmits a training pattern generated and output by the training pattern generation unit 12 (for example, a pattern for toggling a value of each bit) on the transmission path 31.

The reception apparatus 20 includes a receiver unit 21, a voltage-controlled oscillator 22, a sampler unit 23, a control voltage generation unit 24, an error detection unit 25, a training control, unit 26, and an equalizer control unit 27. The receiver unit 21 includes an equalizer unit 21A. The receiver unit 21 inputs a digital signal arriving via the transmission path 31 and outputs a processed digital signal to the sampler unit 23 after processing by the equalizer unit 21A or the like is performed on the digital signal. The equalizer unit 21A compensates for a waveform change due to a characteristic of the transmission path 31 in the received digital signal and outputs the digital signal after the compensation.

The voltage-controlled oscillator 22 inputs a control voltage Vc output from the control voltage generation unit 24 and outputs a clock of a frequency according to a value of the control voltage Vc. The sampler unit 23 inputs the digital signal output from the receiver unit 21, inputs a clock output from the voltage-controlled oscillator 22, and samples and holds data of the digital signal at a timing indicated by the clock to output the sampled and held data. The sampler unit 23 includes an equalizer unit 23A. The equalizer unit 23A compensates for a waveform change due to a characteristic of the transmission path 31 in the received digital signal using the sampled and held data.

The control voltage generation unit 24 obtains a phase or frequency difference between the digital signal output from the receiver unit 21 or the data output from the sampler unit 23 and the clock output from the voltage-controlled oscillator 22. The control voltage generation unit 24 generates a control voltage Vc having a value for which the difference is reduced to output the generated control voltage Vc to the voltage-controlled oscillator 22.

The control voltage generation unit 24 is configured to include a phase/frequency comparison unit, a charge pump, and a loop filter. The phase/frequency comparison unit obtains a phase or frequency relationship between data and a clock on the basis of data obtained through oversampling in the sampler unit 23. The charge pump outputs a current pulse of charging or discharging to the loop filter according to the phase or frequency relationship obtained by the phase/frequency comparison unit. The loop filter includes a capacitance element and increases/decreases an output voltage (control voltage Vc) through charging or discharging of the capacitance element by the charge pump.

The voltage-controlled oscillator 22, the sampler unit 23, and the control voltage generation unit 24 constitute a feedback loop. Phase and frequency differences between the data output from the sampler unit 23 and the clock output from the voltage-controlled oscillator 22 are controlled to be reduced by the feedback loop. In this state, the clock output from the voltage-controlled oscillator 22 serves as a clock recovered on the basis of the received digital signal. Also, the data output from the sampler unit 23 serves as data recovered on the basis of the received digital signal.

The error detection unit 25 detects an error of the digital signal. The error detection unit 25 can detect the error of the digital signal on the basis of a pattern of data output from the sampler unit 23. As a result, when a pattern of data after encoding (for example, 8B10B encoding) is performed is subjected to a restriction based on the encoding, levels of a predetermined number of continuous bits are not the same and an average value of levels of a predetermined number of continuous bits does not deviate from a predetermined range. Therefore, the error detection unit 25 can detect that the digital signal is abnormal when the pattern of the data output from the sampler unit 23 deviates from its constraint.

The training control unit 26 transmits a signal for instructing the transmission apparatus 10 to transmit a training pattern to the transmission path 32. The transmission apparatus 10 receiving this signal transmits the training pattern generated and output by the training pattern generation unit 12 from the driver unit 11 to the transmission path 31. Also, the training control unit 26 instructs the control voltage generation unit 24 to compare frequencies on the basis of the training pattern arriving after being transmitted from the transmission apparatus 10 or the data output from the sampler unit 23.

The equalizer control unit 27 controls an operation in which the equalizer unit 21A compensates a waveform of the digital signal on the basis of the data output from the sampler unit 23. For example, the equalizer unit 21A compensates the waveform of the digital signal by selectively amplifying a high-frequency component of the received digital signal. On the basis of data output from the sampler unit 23, the equalizer control unit 27 determines whether an amplification rate for the high-frequency component in the equalizer unit 21A is in an appropriate range and controls the amplification rate for the high-frequency component in the equalizer unit 21A on the basis of a determination result.

Figure 2:
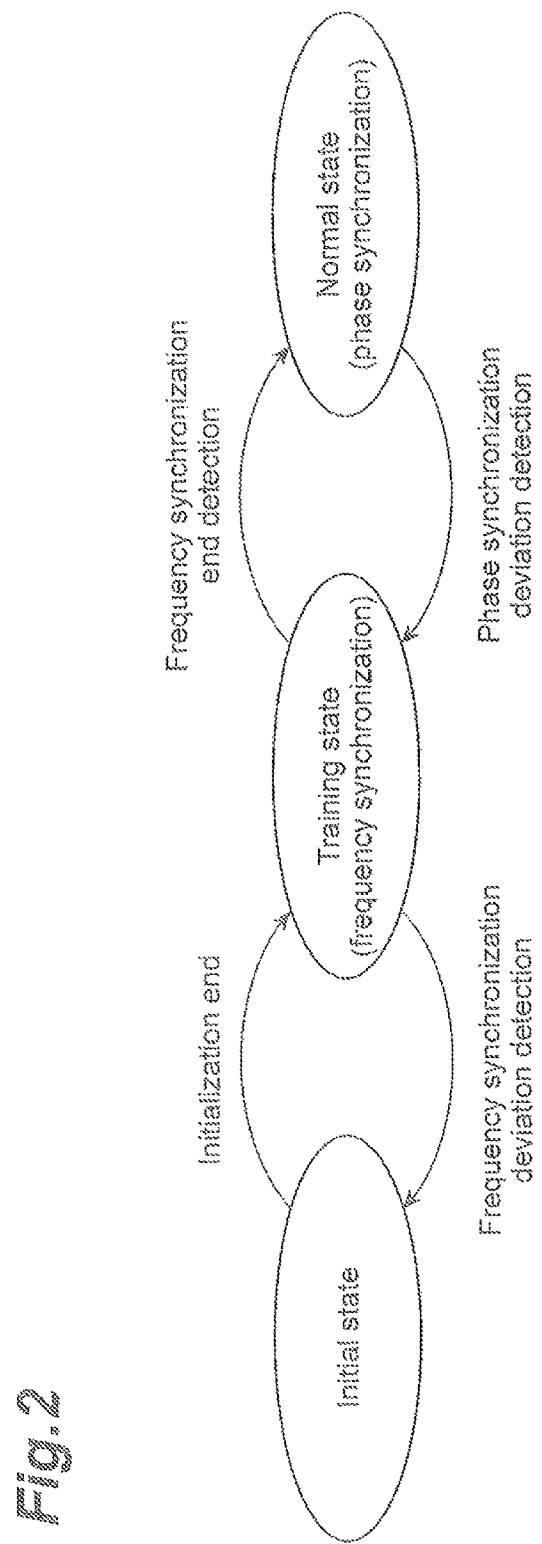
FIG. 2 is a diagram illustrating state transition in CDR.

FIG. 2 is a diagram illustrating state transition in CDR. States in the CDR include an initial state, a training state, and a normal state. In the initial state, the transmission apparatus 10 and the reception apparatus 20 prepare before signal transmission. When this initialization ends, the transition from the initial state to the training state is performed. In the training state, the transmission apparatus 10 transmits a training pattern. The reception apparatus 20 is in a frequency comparison state in which frequency synchronization is acquired between data and a clock by performing a frequency comparison between the data and the clock on the basis of the training pattern. When this frequency synchronization ends, the transition from the training state to the normal state is performed. In the normal state, the transmission apparatus 10 transmits normal data (for example, image data). The reception apparatus 20 can acquire phase synchronization between the data and the clock and recover the data and the clock by performing a phase comparison between the data and the clock on the basis of the normal data.

When noise superimposed on the received digital signal is absent or small (when the digital signal is normal), the transition from the initial state to the training state is performed, the transition from the training state to the normal state is further performed, and the normal state in which the phase synchronization is acquired between the data and the clock continues. In this case, it is possible to recover the data and the clock normally.

If the digital signal is transmitted from the transmission apparatus 10 to the reception apparatus 20 via the transmission path 31 in the normal state, the transition from the normal state to the training state is performed when the deviation of the phase synchronization between the data and the clock increases in the case in which noise is superimposed on a digital signal according to an external factor such as static electricity (the case in which the digital signal is abnormal). Also, when the deviation of the frequency synchronization increases in the training state, the transition from the training state to the initial state is performed. Even when noise is superimposed on the digital signal, the transition from the initial state to the training state is controlled to be performed and the transition from the training state to the normal state is controlled to be performed. However, in this case, the data and the clock to be recovered are not accurate.

When the digital signal returns from an abnormal case to a normal case, the transition from the normal state to the training state is performed because the deviation of the phase synchronization between the data and the clock increases even in the current normal state. Also, if the deviation of the frequency synchronization increases in the training state, the transition from the training state to the initial state is performed. Therefore, after the transition from the initial state to the training state is performed and the transition from the training state to the normal state is further performed, it is possible to recover a clock having an original frequency/phase and recover data having an original value. As a result, a long time period may be required until the original data and clock can be recovered after temporary superimposition of noise on the digital signal stops.

Also, the equalizer control unit 27 for controlling an operation in which the equalizer unit 21A compensates a waveform of the digital signal moves the equalizer unit 21A to a non-optimum state when noise is temporarily superimposed on the digital signal and then returns the equalizer unit 21A to an optimum state when the digital signal returns to the normal case. Even in this case, a long time period may be required until the original data and clock can be recovered by returning the equalizer unit 21A to the optimum state.

Therefore, the reception apparatus 20 of this embodiment performs any one of the following processes 1 to 4 when the error detection unit 25 detects an error of the digital signal. Also, two or three processes of processes 1 to 4 may be performed or all processes of processes 1 to 4 may be performed.

In process 1, the reception apparatus 20 causes a phase/frequency comparison by the control voltage generation unit 24 to be stopped when the error detection unit 25 detects the error of the digital signal. Thereby, it is possible to cause the voltage-controlled oscillator 22 to continue the output of the clock of the frequency before the error detection. It is possible to reduce frequency deviation after noise is removed and shorten a time period until the original data and clock can be recovered.

In process 2, when the error detection unit 25 detects an error of the digital signal, the reception apparatus 20 causes a control operation by the equalizer control unit 27 to be stopped and causes a compensation operation by the equalizer unit 21A before the error detection to continue. Thereby, it is possible to reduce the state transition of the equalizer unit 21A after the noise is removed and shorten a time period until the original data and clock can be recovered.

In process 3, when the error detection unit 25 detects an error of the digital signal, the reception apparatus 20 causes a control operation by the equalizer control unit 27 to be stopped and causes a compensation operation by the equalizer unit 23A before the error detection to continue. Thereby, it is possible to reduce the state transition of the equalizer unit 23A after the noise is removed and shorten a time period until the original data and clock can be recovered.

In process 4, when the error detection unit 25 detects an error of the digital signal, the reception apparatus 20 instructs the transmission apparatus 10 to transmit a training pattern through the training control unit 26 and instructs the control voltage generation unit 24 to perform a frequency comparison on the basis of the training pattern arriving after being transmitted from the transmission apparatus 10 or the data output from the sampler unit 23. Thus, it is possible to acquire frequency synchronization immediately after noise is removed by inputting the training pattern to the reception apparatus 20 in advance and setting the reception apparatus 20 in a frequency comparison state. The frequency synchronization is acquired without moving to the initial state again because the capability of the frequency synchronization is improved, and a time period until the original data and clock can be recovered can be shortened.

Thus, in this embodiment, it is possible to shorten a time period until the original data and clock can be recovered after temporary superimposition of noise on the digital signal stops and consequently improve transmission characteristics.

Figure 3:
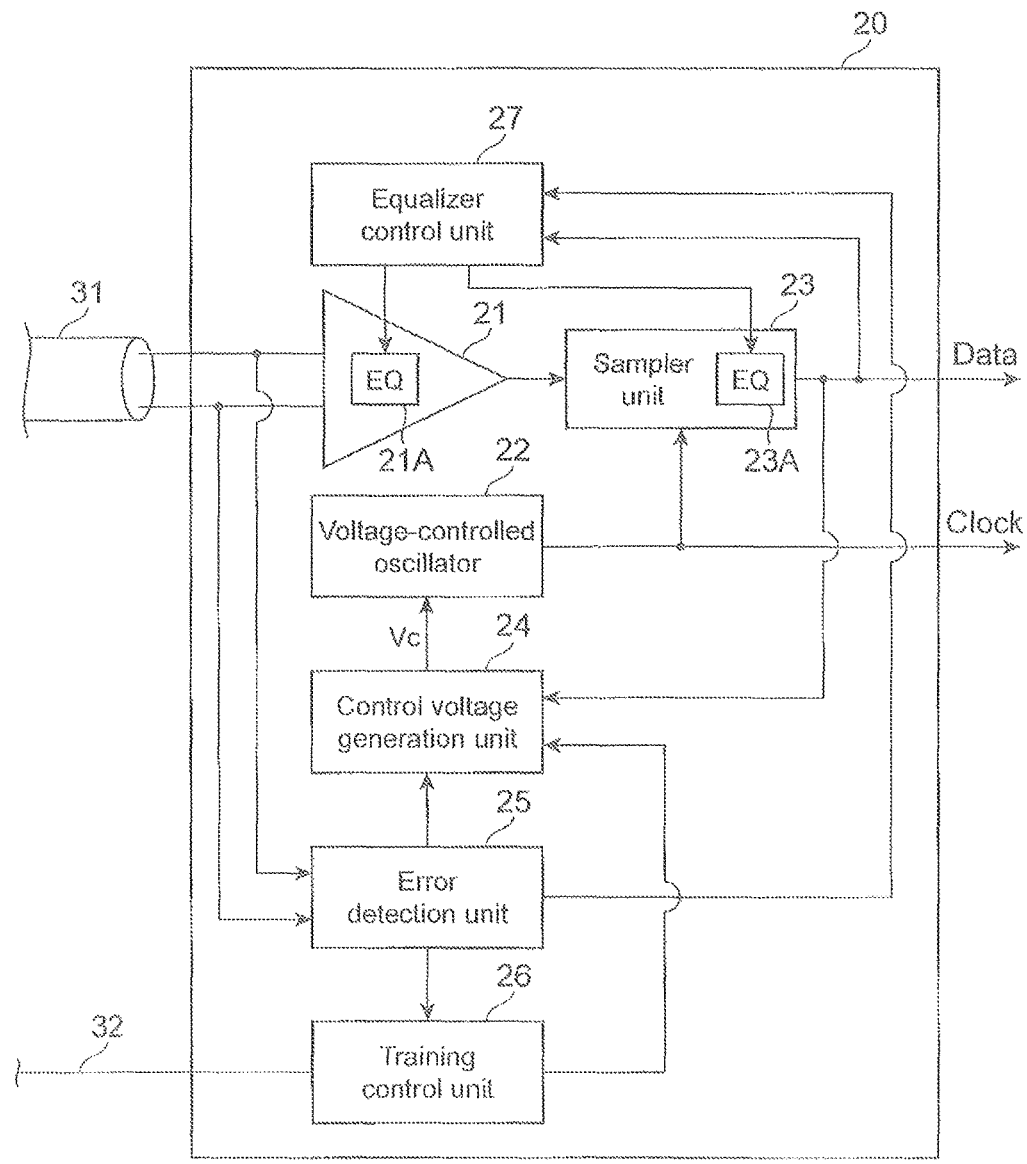
FIG. 3 is a diagram illustrating a configuration of a modified example of a reception apparatus 20.

FIG. 3 is a diagram illustrating a configuration of a modified example of the reception apparatus 20. While the error detection unit 25 of the reception apparatus 20 illustrated in FIG. 1 detects the error of the digital signal on the basis of the pattern of the data output from the sampler unit 23, the error detection unit 25 of the reception apparatus 20 illustrated in FIG. 3 detects the error of the digital signal on the basis of a voltage value of the received digital signal. That is, the error detection unit 25 can detect whether the digital signal is abnormal when the voltage value of the digital signal deviates from a voltage range during a normal operation. When the transmission path 31 is a differential line, the error detection unit 25 may monitor whether a voltage value of each of two lines constituting the differential line deviates from a voltage range during a normal operation or monitor whether a voltage difference between the two lines deviates from a voltage range during the normal operation.

Even in this case, the reception apparatus 20 performs any one of the above-described processes 1 to 4 when the error detection unit 25 detects the error of the digital signal. Thereby, it is possible to shorten a time period until the original data and clock can be recovered after temporary superimposition of noise on the digital signal stops and consequently improve transmission characteristics.

The present invention is not limited to the above-described embodiment, and various modifications are possible. For example, any one of the above-described processes 1 to 4 may be configured to be immediately performed when the error detection unit 25 detects the error of the digital signal or any one of the above-described processes 1 to 4 may be configured to be performed when a period in which the error detection unit 25 detects the error of the digital signal continues for a fixed time or more. Also, processes 1 to 4 may end when the error detection unit 25 ends the detection of the error of the digital signal and each process may end when a fixed time has elapsed after processes 1 to 4 start.

REFERENCE SIGNS LIST

1 Transmission/reception system
10 Transmission apparatus
11 Driver unit
12 Training pattern generation unit
20 Reception apparatus
21 Receiver unit
21A Equalizer unit
22 Voltage-controlled oscillator
23 Sampler unit
24 Control voltage generation unit
25 Error detection unit
26 Training control unit
27 Equalizer control unit
31, 32 Transmission path

The invention claimed is:

1. A receiver that receives a digital signal arriving via a transmission path after being transmitted from a transmitter, the receiver comprising:
    a voltage-controlled oscillator configured to input a control voltage and output a clock of a frequency according to a value of the control voltage;
    a sampler configured to input the digital signal, input the clock output from the voltage-controlled oscillator, and sample and hold data of the digital signal at a timing indicated by the clock to output the sampled and held data;
    a control voltage generator configured to obtain a frequency difference between the digital signal or the data and the clock and generate the control voltage having a value for which the difference is reduced to output the generated control voltage to the voltage-controlled oscillator; and
    an error detector configured to detect an error of the digital signal,
    wherein, when the error detector detects the error of the digital signal, a frequency comparison by the control voltage generator is stopped.

2. A receiver that receives a digital signal arriving via a transmission path after being transmitted from a transmitter, the receiver comprising:
    a voltage-controlled oscillator configured to input a control voltage and output a clock of a frequency according to a value of the control voltage;
    an equalizer configured to compensate for a waveform change due to a characteristic of the transmission path in the received digital signal;
    an equalizer controller configured to control a compensation operation by the equalizer;
    a sampler configured to input the digital signal output from the equalizer unit, input the clock output from the voltage-controlled oscillator, and sample and hold data of the digital signal at a timing indicated by the clock to output the sampled and held data;
    a control voltage generator configured to obtain a frequency difference between the digital signal or the data and the clock and generate the control voltage having a value for which the difference is reduced to output the generated control voltage to the voltage-controlled oscillator; and
    an error detector configured to detect an error of the digital signal, wherein, when the error detector detects the error of the digital signal, a control operation by the equalizer controller is stopped and the compensation operation by the equalizer before the error detection is continued.

3. A receiver that receives a digital signal arriving via a transmission path after being transmitted from a transmitter, the receiver comprising:
a voltage-controlled oscillator configured to input a control voltage and output a clock of a frequency according to a value of the control voltage;
a sampler configured to input the digital signal, input the clock output from the voltage-controlled oscillator, sample and hold data of the digital signal at a timing indicated by the clock to output the sampled and held data, and compensate for a waveform change due to a characteristic of the transmission path in the digital signal received using its result;
an equalizer configured to control a compensation operation by the sampler;
a control voltage generator configured to obtain a frequency difference between the digital signal or the data and the clock and generate the control voltage having a value for which the difference is reduced to output the generated control voltage to the voltage-controlled oscillator; and
an error detector configured to detect an error of the digital signal,
wherein, when the error detector detects the error of the digital signal, a control operation by the equalizer is stopped and the compensation operation by the sampler before the error detection is continued.

4. A receiver that receives a digital signal arriving via a transmission path after being transmitted from a transmitter, the receiver comprising:
a voltage-controlled oscillator configured to input a control voltage and output a clock of a frequency according to a value of the control voltage;
a sampler configured to input the digital signal, input the clock output from the voltage-controlled oscillator, and sample and hold data of the digital signal at a timing indicated by the clock to output the sampled and held data;
a control voltage generator configured to obtain a phase or a frequency difference between the digital signal or the data and the clock and generate the control voltage having a phase or frequency value for which the difference the phase or frequency difference is reduced to output the generated control voltage to the voltage-controlled oscillator;
an error detector configured to detect that the digital signal is abnormal as a result of a temporary superimposition of noise on the digital signal; and
a training controller configured to instruct the transmitter to transmit a training pattern and instruct the control voltage generator to perform a comparison between frequencies of data and clock on the basis of the training pattern arriving after being transmitted from the transmitter or the data output from the sampler when the error detector detects that the digital signal is abnormal.

5. The receiver according to claim 1, wherein the error detector detects the error of the digital signal on the basis of a pattern of data output from the sampler.

6. The receiver apparatus according to claim 1, wherein the error detector detects the error of the digital signal on the basis of a voltage value of the received digital signal.

7. A transmission/reception system comprising:
a transmitter configured to transmit a digital signal; and
the receiver according to claim 1 configured to receive the digital signal arriving via the transmission path after being transmitted from the transmitter.

8. The receiver according to claim 2, wherein the error detector detects the error of the digital signal on the basis of a pattern of data output from the sampler.

9. The receiver according to claim 2, wherein the error detector detects the error of the digital signal on the basis of a voltage value of the received digital signal.

10. A transmission/reception system comprising:
a transmitter configured to transmit a digital signal; and
the receiver according to claim 2 configured to receive the digital signal arriving via the transmission path after being transmitted from the transmitter.

11. The receiver according to claim 3, wherein the error detector detects the error of the digital signal on the basis of a pattern of data output from the sampler.

12. The receiver according to claim 3, wherein the error detector detects the error of the digital signal on the basis of a voltage value of the received digital signal.

13. A transmission/reception system comprising:
a transmitter configured to transmit a digital signal; and
the receiver according to claim 3 configured to receive the digital signal arriving via the transmission path after being transmitted from the transmitter.

14. A transmission/reception system comprising:
a transmitter configured to transmit a digital signal; and
the receiver according to claim 4 configured to receive the digital signal arriving via the transmission path after being transmitted from the transmitter,
wherein, when the receiver instructs the transmitter to transmit the training pattern, the transmitter transmits the training pattern to the receiver.

15. The receiver according to claim 4, wherein the error detector detects the error of the digital signal on the basis of a pattern of data output from the sampler.

16. The receiver according to claim 4, wherein the error detector detects the error of the digital signal on the basis of a voltage value of the received digital signal.

17. A transmission/reception system comprising:
a transmitter configured to transmit a digital signal; and
the receiver according to claim 4 configured to receive the digital signal arriving via the transmission path after being transmitted from the transmitter.

* * * * *